United States Patent
Singh et al.

(10) Patent No.: US 9,368,367 B2
(45) Date of Patent: Jun. 14, 2016

(54) CHEMICAL MECHANICAL POLISHING OF SILICON CARBIDE COMPRISING SURFACES

(75) Inventors: Rajiv K. Singh, Gainesville, FL (US); Arul Chakkaravarthi Arjunan, Gainesville, FL (US); Dibakar Das, Gainesville, FL (US); Deepika Singh, Gainesville, FL (US); Abhudaya Mishra, Gainesville, FL (US); Tanjore V. Jayaraman, Gainesville, FL (US)

(73) Assignees: Sinmat, Inc., Gainesville, FL (US); University of Florida Research Foundation, Inc., Gainesville, FL (US)

( * ) Notice: Subject to any disclaimer, the term of this patent is extended or adjusted under 35 U.S.C. 154(b) by 519 days.

(21) Appl. No.: 12/422,771

(22) Filed: Apr. 13, 2009

(65) Prior Publication Data

US 2010/0258528 A1   Oct. 14, 2010

(51) Int. Cl.
*C09K 3/14* (2006.01)
*C23F 1/14* (2006.01)
*H01L 21/3105* (2006.01)
*C09G 1/02* (2006.01)
*H01L 21/04* (2006.01)
*H01L 21/306* (2006.01)
*H01L 21/02* (2006.01)

(52) U.S. Cl.
CPC ............ *H01L 21/31053* (2013.01); *C09G 1/02* (2013.01); *C09K 3/1463* (2013.01); *C23F 1/14* (2013.01); *H01L 21/02024* (2013.01); *H01L 21/0475* (2013.01); *H01L 21/30625* (2013.01)

(58) Field of Classification Search
None
See application file for complete search history.

(56) References Cited

U.S. PATENT DOCUMENTS

| | | | |
|---|---|---|---|
| 6,299,795 B1 | 10/2001 | Liu et al. | |
| 6,375,545 B1 * | 4/2002 | Yano et al. | 451/36 |
| 6,464,740 B1 | 10/2002 | Towery et al. | |
| 6,720,264 B2 | 4/2004 | Sahota et al. | |
| 6,835,120 B1 | 12/2004 | Matsui | |
| 2002/0004360 A1 * | 1/2002 | Ota et al. | 451/60 |
| 2004/0060502 A1 | 4/2004 | Singh | |

(Continued)

FOREIGN PATENT DOCUMENTS

JP      2008068390      3/2008
WO   WO 2008102672 A1 *   8/2008

OTHER PUBLICATIONS

Tohru Hara, et al., "Mechanism of Mechanical and Chemical Polishing in Low Dielectric Constant Plasma-Enhanced Chemical Vapor Deposition SiOC Layer from Hexamethyldisiloxane", Electrochemical and Solid-State Letters, G65-G67 (2001).

(Continued)

*Primary Examiner* — Shamim Ahmed
*Assistant Examiner* — Bradford Gates
(74) *Attorney, Agent, or Firm* — Jetter & Associates, P.A.

(57) ABSTRACT

Slurry compositions and chemically activated CMP methods for polishing a substrate having a silicon carbide surface using such slurries. In such methods, the silicon carbide surface is contacted with a CMP slurry composition that comprises i) a liquid carrier and ii) a plurality of particles having at least a soft surface portion, wherein the soft surface portion includes a transition metal compound that provides a Mohs hardness <6, and optionally iii) an oxidizing agent. The oxidizing agent can include a transition metal. The slurry is moved relative to the silicon carbide comprising surface, wherein at least a portion of the silicon carbide surface is removed.

7 Claims, 1 Drawing Sheet

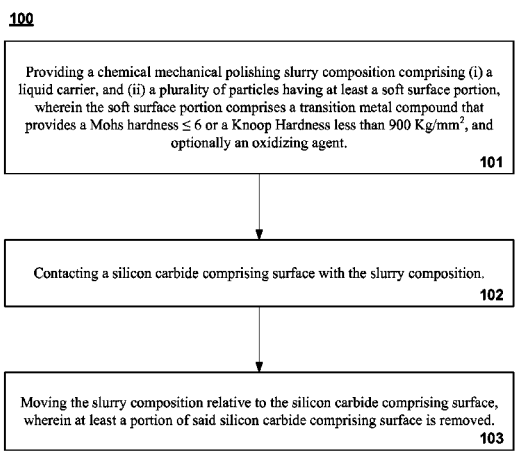

(56) References Cited

U.S. PATENT DOCUMENTS

| | | | |
|---|---|---|---|
| 2006/0261040 A1* | 11/2006 | Klein et al. | 252/79.1 |
| 2007/0045233 A1* | 3/2007 | Yoneda et al. | 216/88 |
| 2007/0224806 A1* | 9/2007 | Yamashita | 438/633 |
| 2008/0057713 A1 | 3/2008 | Desai et al. | |
| 2008/0153292 A1 | 6/2008 | White et al. | |
| 2009/0280329 A1* | 11/2009 | Rukavina | B32B 17/1077 428/412 |
| 2009/0317638 A1* | 12/2009 | Kawabata et al. | 428/409 |
| 2011/0123770 A1* | 5/2011 | Greer et al. | 428/143 |

OTHER PUBLICATIONS

Makoto Sato et al., "Polishing of Single Crystal SiC with the LHA Pad", pp. 271-276. The 11th International Conference on Precision Engineering (ICPE), Aug. 16-18, 2006, Tokyo, Japan.

Jin-Goo Park, et al., CMP Defects; Their Detection and Analysis on Root Causes. ECS Trans., 2012, vol. 44, Issue 1, pp. 559-564, Abstract only.

* cited by examiner

100

---

Providing a chemical mechanical polishing slurry composition comprising (i) a liquid carrier, and (ii) a plurality of particles having at least a soft surface portion, wherein the soft surface portion comprises a transition metal compound that provides a Mohs hardness ≤ 6 or a Knoop Hardness less than 900 Kg/mm², and optionally an oxidizing agent.

101

Contacting a silicon carbide comprising surface with the slurry composition.

102

Moving the slurry composition relative to the silicon carbide comprising surface, wherein at least a portion of said silicon carbide comprising surface is removed.

103

CHEMICAL MECHANICAL POLISHING OF SILICON CARBIDE COMPRISING SURFACES

FIELD OF THE INVENTION

Embodiments of the present invention relate to chemical mechanical polishing (CMP) of silicon carbide comprising materials, such as for fabricating integrated circuits (ICs) including silicon carbide comprising materials.

BACKGROUND

Silicon carbide possesses unique electrical and physical properties that make it suitable for high power, high frequency and high temperature electronic devices including ICs. Such properties have fueled an intense research effort in the last several years that has prompted the need to develop larger sized, epi-ready and substantially defect/damage-free silicon carbide wafers.

The preparation of silicon carbide wafers is known to require multiple polishing steps including a mechanical polishing step in which particles which are typically harder than silicon carbide (Mohs hardness of 9, Knoop hardness 2,400-3,000 Kg/mm$^2$), such as boron nitride (BN; Mohs hardness of 9.9, Knoop hardness 4,500-5,000 Kg/mm$^2$) or diamond (Mohs hardness of 10, Knoop hardness 8,000-12,000 Kg/mm$^2$) or Boron Carbide (Mohs hardness 9.35, Knoop hardness 2,900-3,580 Kg/mm$^2$) are used to achieve reasonable silicon carbide polishing rates. The very hard particles required for the mechanical polishing step generally results in a high degree of damage to the silicon carbide surface including scratches and dislocations which generally develop both at the surface and sub-surface of the wafer. The mechanical polishing step is typically followed by a CMP step which uses particles that are still abrasive, but are less abrasive as compared to diamond or BN, such as aluminum oxide (Mohs hardness about 9, Knoop hardness 1,800-2,200 Kg/mm$^2$), titania (Mohs hardness of 5.5 to 6.5 Knoop Hardness 500-600 Kg/mm$^2$), or Garnet Mohs hardness about 8, Knoop hardness 1360 Kg/mm$^2$, silica/quartz (Mohs hardness of 7, Knoop Hardness 900-1,200 Kg/mm$^2$), or zirconia (Mohs hardness about 8, Knoop hardness 1,120 Kg/mm$^2$ to polish the surface regions and attempt to reduce the surface and sub-surface damage induced by the mechanical polishing.

Typically the abrasives that are harder than silicon carbide provide reasonably high polishing rates, but cause significant surface and sub-surface damage. The abrasives which are softer than silicon carbide typically provide low polishing rates, and significantly less damage. Since the CMP particles used are still significantly abrasive, new damage is generated during the CMP process. Moreover, since silicon carbide and silicon carbide comprising materials are generally chemically inert materials, the CMP process typically is very slow, and thus requires a long cycle time, as the slurry chemicals do not react with the silicon carbide comprising surface. Therefore, there is a need to develop new CMP slurries and/or methods for polishing silicon carbide comprising materials which decrease damage and increase the polishing rate.

SUMMARY

This Summary is provided to comply with 37 C.F.R. § 1.73, presenting a summary of the invention to briefly indicate the nature and substance of the invention. It is submitted with the understanding that it will not be used to interpret or limit the scope or meaning of the claims.

Embodiments of the present invention describe slurry compositions and chemically activated CMP methods for polishing a substrate having a silicon carbide comprising surface using such slurries. In such methods, the silicon carbide comprising surface is contacted with a CMP slurry composition that comprises i) a liquid (e.g. water) carrier, ii) and a plurality of particles having at least a soft surface portion, wherein the soft surface portion comprises a transition metal compound that provides a Mohs hardness ≤6 or Knoop Hardness less than 900 Kg/mm$^2$. Optionally, iii) an oxidizing agent can be added. The slurry is moved relatively near or close to the silicon carbide comprising surface, wherein at least a portion of the silicon carbide comprising surface is removed.

The soft surfaced particles can be what are referred to herein as "coated particles" in some embodiments of the invention or "soft functionalized particles" in other embodiments of the invention. Soft functionalized particles generally comprise a thin soft surface coating comprising a water insoluble compound of a transition metal on an abrasive surface. Soft functionalization is defined herein as the arrangement where the thickness of the transition metal comprising coating on the core particles is between 0.001 monolayers to 10 monolayers, and comprised of transition metal comprising materials that have a Knoop Hardness of 900 Kg/mm$^2$ when measured in their bulk form. The soft surface coating of the soft functionalized particles can be a discontinuous or continuous coating, and its thin nature results in its surface properties generally being different from the core but having a hardness that will generally be similar to the core. In contrast, coated particles have a coating that is generally a continuous coating that is thicker and is typically much thicker (e.g. >10 monolayers to 100,000 monolayers (about 30 microns)) as compared to the coating for the soft functionalized particles, and its surface properties surface properties and hardness will generally be controlled by the coating and thus be different from the core.

The soft surfaced particles in slurries according to embodiments of the invention have been found to unexpectedly provide high polishing rates considering the much harder and highly inert silicon carbide comprising surface, such as removal rates of ≥200 nm/hr. Moreover, slurries according to embodiments of the invention have been found to significantly reduce surface and sub-surface damage present from earlier processing. Accordingly, embodiments of the invention provide new CMP slurries and related methods for polishing silicon carbide comprising materials which significantly increase the polishing rate and decrease damage to the silicon carbide comprising surface.

BRIEF DESCRIPTION OF THE DRAWING

FIG. 1 shows steps in an exemplary method of chemical mechanical polishing of a silicon carbide comprising surface, according to an embodiment of the invention.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 shows steps in an exemplary method 100 of chemical mechanical polishing a substrate having a silicon carbide comprising surface, according to an embodiment of the invention. Step 101 comprises providing a chemical-mechanical polishing slurry composition. The slurry composition comprises i) a liquid (e.g. water) carrier, and ii) a plurality of particles having at least a soft surface portion, wherein the soft surface portion comprises a transition metal compound that provides a Mohs hardness ≤6 or a Knoop Hardness less than 900 Kg/mm$^2$. Optionally, the slurry composition can further comprise iii) an oxidizing agent, wherein the oxidizing agent comprises a transition metal ion.

Step 102 comprises contacting the silicon carbide comprising surface with the slurry composition. Step 103 comprises moving the slurry composition relatively near or close to relative to the silicon carbide comprising surface, wherein at least a portion of the silicon carbide comprising surface is removed.

The silicon carbide comprising surface can generally be of any orientation. For silicon face, carbon face, mixed face, m-face, a-face, generally any miscut from regular crystallographic faces, any polytype, mixed polytype, doped, undoped, polycrystalline, amorphous, cubic or hexagonal symmetry. In some embodiments, especially thin films, silicon and carbon can mixed with other compounds, such as boron, aluminum, oxygen and nitrogen.

As mentioned above, the soft surfaced particles in slurries according to embodiments of the invention have been found to unexpectedly provide a high polishing rate for the much harder and highly inert silicon carbide comprising surface, such as a removal rate ≥200 nm/hr, including removal rates >1,000 nm/hr (>1 µm/hr), along with a significant reduction in surface and sub-surface damage that is left over from prior polishing using a harder abrasive. Although not required to practice embodiments of the present invention, the Present Inventors provide herein some mechanisms believed to be operable that can be used to explain the unexpectedly high removal rate provided by CMP processing with the use of particles having a soft surface according to embodiments of the invention.

CMP processes according to embodiments of the invention may generally be based on catalytic breakdown of the oxidizing agent which provides reactive species that increase the removal rate. The catalytic action can be enhanced by one or more of higher temperature (e.g. 35 to 90° C.), rubbing action during the CMP process, presence of insoluble compounds and elements of transition metals, functionalization of the surface of a particle with insoluble elements or compounds of transition metals, presence of soluble transition metal ions, increase in friction during the polishing, formation of insoluble transition metal compound during polishing as a result of breakdown of the oxidizer, or coating of pad surface with a transition metal oxide or insoluble compound.

Examples of oxidizers than can be catalytically accelerated include peroxides, permanganates, perchlorates, and oxidizers containing transition metal elements such as permanganates, ferrocyanides, ferricyanides, chromates, cerium ammonium nitrates. Examples of oxidizers that breakdown into insoluble compounds of transition elements include permanganates and chromates. Examples of oxidizers than breakdown into insoluble products that generally coat the polishing pad include, permanganates, and chromates. The pad coating can be in form insoluble surface films as a result of byproducts from the slurry. The term "byproducts" as used herein refers to insoluble compounds formed from either the breakdown of the oxidizers or reactant products from the chemicals in the slurry and the silicon carbide comprising surface.

The catalytic action can be accelerated by a local temperature increase that can occur during the polishing process itself. In another embodiment, the temperature can be increased by providing an external heating source, such as heated slurries, heating of the pad and polishing apparatus using lamps, and resistively heating sources. The catalytic action can also be provided by ultraviolet (UV) breakdown using high photon energy sources such as UV lamps. The catalytic action can be accelerated also by the presence of soluble ions (e.g. transition metal ions of manganese, zinc, chromium, iron, cobalt, copper,) insoluble soft surface compositions (e.g. transition metal (Mn, Cu, Zn, Co, Fe, Ni) oxides, nitrides, chlorides, sulfates, nitrates carbonates (e.g. $MnO_2$, $MnCl_3$, $TiO_2$, $CuO$), or transition metals (Fe, Mn, Zn, Co, Ag) during the polishing process.

The catalytic action can be also be accelerated by soft functionalization to form soft functionalized particles. As defined above, soft functionalized particles generally comprise a soft surface coating portion that is 0.001 monolayers to 10 monolayers thick on an abrasive surface, wherein the soft surface comprises an insoluble compound of a transition metal that has a Knoop Hardness of 900 Kg/mm$^2$ when measured in its bulk form.

Examples of soft surfaces can include, water insoluble transition metal comprising compounds, such as oxides, chloride, carbonates, nitrates, sulfates of transition metals. The soft surfaces can also include elements and alloys of transition elements. The transition metals can include copper, or manganese, zinc, iron, titanium, cerium, cobalt, silver located in Periods 4, 5, and 6 of the periodic table. "Soft surface" as used herein can also include certain polymeric materials including PMMA, polystyrene, and polyurethane. In a specific embodiment, the soft surface transition metal compound can comprise an Mn comprising compound in which Mn is in the $Mn^{+0}$ state, or $Mn^{+3}$ or $Mn^{+4}$ oxidation states. For example, the Mn comprising compound can consist essentially of at least one of $MnO_2$ and $MnCl_3$ and thus essentially be the only particles in the slurry. In the case of $MnO_2$ and $MnCl_3$ particles, the estimated Mohs hardness for both of these materials is <3. Such particles generally have a size from 0.5 nm to 100 nm. The concentration of the soft particles can vary from 0.0000001% to 50% by weight. Other examples of soft surfaces include, cerium oxide, zinc oxide, copper oxide, nitrides, carbonates oxides of transition metals, transition metals and forms of silica having a Mohs hardness of ≤6, including nanoporous silica (i.e. having nanosized pores), as well as other nanoporous materials including porous alumina. For example, nanoporous silica particles can be formed by a modified Stober process (W. Stober, A. Fink, E. Bohn, J. Colloids and Interfacial Science, 26, 62-69 (1968)). The particle size in this embodiment can vary from 20 nm to 500 nm, while the porosity can vary from 10 to 60%. As the porosity of the surface increases, the numbers of adsorption sites are expected to decrease.

The particle size of soft surfaced particles can generally vary from 1 nm to 100 microns. In this embodiment, the concentration of particles can vary from 0.000001 weight percent to 50 weight percent of the slurry.

In some embodiments of the invention the soft surface composition can be coated onto a core particle that has a higher hardness, such as a hard abrasive, to form soft surfaced composite particles. In this embodiment, the composite particles can comprise a core having a first hardness and a coating of the soft surface on the core having a second hardness, wherein the second hardness<the first hardness by at least one (1) Mohs number or at least a Knoop hardness of 100 Kg/mm². For example, if the hardness of the coating has a Mohs number of 3, then the hardness of the core particle is at least a Mohs number of 4. Another example includes if the Knoop hardness of the coatings is 200 Kg/mm², the hardness of the core is at least 300 Kg/mm². Inorganic core particles for the soft surface coated particles can be silica, titania nanoporous particles, silicon nitride, alumina, yttria, zirconia, diamond, ceria. Core particles can also be multiphase particles, where the cores are coated or mixed with another layer. The primary size of the core particles can vary from 2 nm to 100 microns. The size can be between 10 nm to 1000 nm. The primary particle size refers to the minimum unaggregated size of the particles. The surface coatings can be continuous or discrete and provide 2% to 100% core particle surface area coverage. The thickness of the soft coatings can vary from 0.5 nm to 500 nm. In one embodiment, the thickness of the solid coating is between 10 nm to 100 nm.

Example of composite particles include coatings of water insoluble compounds of transitions metals (e.g. $MnO_2$, ZnO, Cerium oxide, copper oxide, cobalt oxide, iron oxide, $MnCl_3$, other chlorides, nitrides, carbonates, of transition materials, transition metals) on silica, ceria, alumina, titania, silicon carbide, silicon nitride, boron nitride, or diamond particles. The size of the composite particles is generally from 1 nm to 100 microns. The concentration of composite particles can vary from 0.000001 weight percent to 50 weight percent of the slurry. In yet another embodiment, the particles include soft surface particles and particles having a hard abrasive surface.

Soft functionalized particles typically comprise ultra thin coatings with partial or complete surface coverage which can alter the properties of the particles but may not be visually different from a uncoated particle. In this embodiment, the functionalized particles can comprise a core having a first hardness and a coating of the soft functionalization on the core having a second hardness if measured in bulk form, wherein the second hardness<the first hardness by at least one (1) Mohs number or at least a Knoop hardness of 100 Kg/mm². For example if the hardness of the functionalized surface material in bulk form has a Mohs number of 3, then the hardness of the core particle is at least a Mohs number of 4. Another example includes if the Knoop hardness of the surface functionalization material in bulk form is 200 Kg/mm², the hardness of the core particle is at least 300 Kg/mm². Example of a hard core abrasives include, are but not limited to, silica, alumina, titania, ceria, silicon nitride, silicon carbide, boron nitride and diamond.

Example of functionalized surfaces of core particles include water insoluble compounds of transitions metals (e.g. $MnO_2$, ZnO, Cerium oxide, copper oxide, cobalt oxide, iron oxide, $MnCl_3$, other chlorides, nitrides, alkoxides, carbonates, of transition materials, transition metals including zinc, manganese, copper, cobalt, and from period 3, 4 and 5 of the periodic table) on silica, ceria, alumina, titania, silicon carbide, silicon nitride, boron nitride, or diamond particles. The size of the functionalized particles is generally from 1 nm to 100 microns. The concentration of functionalized particles can vary from 0.000001 weight percent to 50 weight percent of the slurry.

The functionalization and coatings on core particles can be achieved by various means including physical vapor deposition, chemical vapor deposition, and wet chemistry methods. Using wet chemistry methods, the core particles can be immersed into a liquid which can breakdown to form insoluble compounds that can functionalize/coat the surface of the core particles. The breakdown of the liquid into insoluble products can occur by external action including addition of at least one other chemical to the slurry solution containing the original chemical and the core particle. The second chemical may help to break down the original chemical to form insoluble compounds that can coat the surface of the particles. The breakdown of the coatings/functionalization chemicals can occur by other means including stirring, heating, presence of light, or keeping the particles mixed with an chemicals for an extended period of time greater than 30 minutes.

In the presence of UV light the time to functionalize the surface will generally be less than 5 minutes. The occurrence of the functionalization can be determined from change in the property of the functionalized particles including but not limited to change in color of the particle, dispersion characteristics, particle flow behavior, coagulation, optical, electrical magnetic, electronic, mechanical and other properties. One method of observing functionalization/coating is to observe the change in color of the particle or change in dispersion characteristics of the particle. In one embodiment the dispersion characteristics of a silica particle are observed in the acidic pH range (pH 2 to pH 7). Typically, colloidal silica particles in the pH range of 4 to 7 are unstable and can gel to form large networks of particles that cannot be redispersed. Functionalization of the core abrasive silica particle can reduce or eliminate the gelation process so that the particles can be easily redispersed.

In another embodiment, both coated particles and/or soft functionalized particles may be mixed with abrasives particles such as silica, alumina, zirconia, diamond, boron nitride. The percentage of coated/functionalized particles compared to total particles can vary from 5% to 100%.

The oxidizing agent can comprise a peroxide such as hydrogen peroxide, ammonium cerium nitrate, periodates, periodic acid, iodates, persulfates, chromates, permanganates, ferricyanides, bromates, perbromates, ferrates, perrhenates, perruthenates, and mixtures thereof. In one specific embodiment, the oxidizing agent comprise a water soluble transition metal compound that provides transition metal ions, such as Mn. Examples of water soluble transition metal based oxidizers include permanganates, such as $KMnO_4$. As known in the chemical arts, permanganate is the general name for a chemical compound containing the manganate (VII) ion, ($MnO_4-$). Ferricyanides is another class of water soluble transition metal compounds. As known in the chemical arts, ferricyanide is the anion $[Fe(CN)_6]_3-$. The oxidizers can include compounds after reaction form insoluble transition metal compounds. For example, the permanganate ion can form insoluble manganese oxide, and chromate based oxidizers can form the chromium oxide.

It is also generally desirable to ensure that the slurry particles do not gel in a colloidal suspension in the normally high ionic strength slurry. The Present Inventors have found that slurry stability can generally be improved by a surfactant because surfactant covered particles repel one another and as a result tend not to agglomerate. As used herein, the term "surfactant" refers to a material having both a lipophilic component and a hydrophilic component, and includes surface active polymers. As known in the art, surfactants are generally classified by the presence of formally charged groups in its head, with non-ionic, cationic, anionic, and cationic surfactants. If a surfactant contains a head with two oppositely charged groups, it is termed zwitterionic. All surfactant types can generally be used with embodiments of the invention.

The concentration of surfactants used depends on the type of the surfactant used, the surfaces of particles and wafers. At low concentrations, the surfactant may adsorb onto the solid surfaces in a patchy manner and change the electrostatic properties and the surface energy of the surface. The adsorption of the surfactant under these conditions may reduce the etching of the surface layer. At higher concentrations of the surfactant, the surfactant molecules may coalesce together to form self-assembled structures. Examples of structured surfactants can include spheres, cylindrical rods, bi-layers, disks and vesicles. Once the bulk critical micelle concentration (CMC) is reached, the surface tension of the solution does not generally decrease any further, but is accompanied by a rapid drop in the electrical conductivity of the bulk solution.

In one embodiment, the surfactant concentration is at least 0.0001 of the CMC for non-ionic surfactactants and at least 0.001 CMC of cationic and anionic surfactactants. As described above, the soft coating or soft coating portion may also help ensure non-gelling of the slurry particles.

The slurry may also include other additives including salts, biocides, pH stabilizing agents, and soluble ions of various elements including alkali and transitions metals. For example, the salt can comprise KI, KBr, $KCO_3$, KCl, $NH_4I$ or $NH_4Cl$. The concentration of the salt can range from 0.001M to 5M.

The pH of the slurry can vary from 0.1 to 13.9, although during CMP processing the pH of the slurry is generally ≤8, or <5 such as 2 to 5. During storage, particularly when the oxidizing agent comprises permanganate, the pH of the slurry is generally ≥8. To prepare for use, an acid, such as nitric acid can be used to reduce the pH to raise the removal rate as evidenced in the examples described below.

The silicon carbide comprising surfaces can be in the form of a substrate (e.g. a wafer having a thickness greater than 100 microns) or in the form of a thin or thick film (with a thickness less than 100 microns). The silicon carbide comprising film can be single crystal, polycrystalline or have an amorphous structure. The surface of the silicon carbide comprising material can be either carbon face, silicon face, or a mixture or amorphous in nature. The silicon-carbide surface can also be composed of materials in non-stochiometric amorphous can be materials in a dielectric form (such as carbon doped silicon oxide or carbon doped silicon nitride) used in low k (dielectric constant less than 4) applications with a overall composition of $Si_x$—$C_y$—$N_z$—$O_a$ where x, y, can vary from 0.05 to 0.95, while z, a can vary from 0.00 to 0.90. Such dielectric films can be used in formation of copper based interconnects, metal gate electronics or generally any dielectric films application in the silicon based semiconductor industry.

Slurries according to embodiments of the invention can be premixed or mixed in situ during the CMP process. As described above, premixed slurries may be stored in alkaline pH conditions and acid added before CMP use. In a typical embodiment, a first and second water soluble composition are dissolved in water which react and form soft insoluble particles or coat core particles if provided in the slurry to form composite particles having a soft surface. The CMP pad is also coated with the insolubles. An oxidizer can be added, or be one of the water soluble compositions provided in stoichiometric excess.

Polishing of silicon carbide comprising materials according to embodiments of the invention can benefit a wide variety of applications. For example, embodiments of the invention can be used in applications such as dielectric films in semiconductor integrated circuits, optoelectronic devices such as light emitting devices (LEDs) and lasers, microelectromechanical systems (MEMS) based devices, and biomedical systems.

EXAMPLES

Embodiments of the present invention are further illustrated by the following specific Examples, which should not be construed as limiting the scope or content of embodiments of the invention in any way.

Example 1

Slurry with In-Situ Formed Soft Particles

Soft particles comprising $MnCl_3$ and manganese oxide $MnO_2$ were prepared by adding 0.023M $MnCl_2$ (which is water soluble) to a 0.015 $KMnO_4$ solution. Insoluble manganese compounds $MnCl_3$ (an example of Mn(III) state compound) and $MnO_2$ (an example of Mn(IV) compound) were formed upon the addition of $MnCl_2$. Once the particles were made, a stoichiometric excess of $KMnO_4$ was added in the slurry solution remaining to function as an oxidizer. The insoluble manganese compounds each had a Mohs hardness estimated as <3. The pH of the solutions was adjusted in the range between 2 to 9. The slurry was used to a polish a silicon face SiC substrate (wafer). The polishing system comprised a Buehler apparatus running at 50-200 rpm and at a pressure from 0.1 to 10 psi. In these examples the pressure was 6.4 psi and the rotation speed was 90 rpm. The removal rates shown below were obtained using the above described slurry. Note the very high removal rates obtained, such as >500 nm/hr.

| pH  | Concentration $KMnO_4$ (M) | Removal Rate nm/hr |
| --- | --- | --- |
| 2   | 0.4  | 1400 |
| 4   | 0.4  | 1290 |
| 6.5 | 0.4  | 560  |
| 9.0 | 0.4  | 360  |
| 4.0 | 0.1  | 360  |
| 3.0 | 0.02 | 100  |

Example 2

Slurry with Soft Surfaced Composite Particles, No Oxidizer

The soft surface comprised $MnCl_3$ and $MnO_2$ as described above in Example 1. The polishing using such coated particles were compared to polishing using uncoated silica particles. A significant increase in removal rate is demonstrated even in absence of the oxidizer.

| pH  | Particle Coating | Core Particle | part Conc (wt %) | RR (nm/hr) |
| --- | --- | --- | --- | --- |
| 4.5 | Mn (III)/Mn (IV) | 135 nm silica | 10%  | 84   |
| 6.5 | Mn (III)/Mn (IV) | 135 nm silica | 10%  | 109  |
| 6.5 | none             | 135 nm silica | 10%  | 1 to 5 |
| 2   | Mn (III)/Mn (IV) | 135 nm silica | 2.8% | 119  |
| 2   | Mn (III)/Mn (IV) | alumina       | 2.8% | 162.5 |

This example evidences a highly unexpected result, namely, a significantly higher removal rate with the particles having the soft coating (Mohs hardness around 3) as compared to the removal rate with uncoated abrasive core particle (Mohs hardness around 7 for silica, higher for alumina).

Example 3

Slurry with Soft Surfaced Composite Particles with Oxidizer Added

The soft surface comprised $MnCl_3$ and $MnO_2$ on various core particles described above in example 1. $KMnO_4$ was added as an oxidizer. The oxidizer concentration was 0.35 M

| pH | Core Particle | RR (nm/hr) |
|---|---|---|
| 3 | Silica 135 nm | 1350 |
| 3 | Alumina 800 nm | 1800 |
| 3 | Diamond 0.2 micron | 2300 |
| 3 | Alumina 300 nm | 1700 |

Comparing example 1 to example 3, the addition of the $KMnO_4$ is seen to increase the RR about an order of magnitude.

Example 4

The Use of Coated and Uncoated Particle for Different Oxidizers and Particle Systems Different coated particle in present of different transition metal ion containing oxidizers show significantly higher removal rates compared to uncoated particles or without the use of oxidizers.

| Sample No | Slurry transition metal based oxidizer/Soft Particles | Removal rate in nm/hr |
|---|---|---|
| 1 | Potassium dichromate (0.1 mol) + 1% of MnO2 coated 135 nm silica particle + water @ pH2 | 69 |
| 2 | Potassium Ferricynide (0.1 mol) + 1% of MnO2 coated 135 nm silica particle + water @ pH2 | 20 |
| 3 | Chromium (VI) oxide 2% + 1% 135 nm silica particle + 0.1 mol KMno4 + water @ pH2 | 106 |
| 4 | Potassium Chromate (0.1 mol) + 1% 135 nm silica particle + water @ pH2 | 87.5 |
| 5 | Cupric sulfate (0.1 mol) + 1% 135 nm silica particle + water @ pH2 | 87.5 |
| 6 | Cupric sulfate (0.1 mol) + 1% of MnO2 coated 135 nm silica particle + water @ pH2 | 34 |
| 7 | Cobaltous sulfate + 1% 135 nm silica particle water @ pH2 | 24 |
| 8 | Cobaltous sulfate + 1% of MnO2 coated 135 nm silica particle water @ pH2 | 19 |
| 9 | Lithium Cobalt (III) Oxide (1%) + 1% 135 nm silica particle + 0.1 mol $KMnO_4$ + water@ pH2 | 725 |
| 10 | Cupric sulfate (1%) + 1% 135 nm silica particle + 0.1 mol $KMnO_4$ + water@ pH2 | 131 |
| 11 | Cerium Oxide coated silica (75 nm) + 0.3 Mol KMnO4 + water @ pH2 | 1320 |
| 12 | 1% SiC particle (<1500 grit) + 1% of MnO2 coated 135 nm silica particle + 0.3 $KMnO_4$ + water@ pH2 | 756 |
| 13 | 1% Boron Nitride particle (0.3 to 0.7 nm) + 1% of MnO2 coated 135 nm silica particle + 0.3 $KMnO_4$ + water @ pH2 | 932 |

The polishing conditions for the data above comprised 6 psi pressure, platen linear velocity of 0.17 m/sec, head rpm 60/min, and the wafer polished a 6H SiC wafer Example 5

AFM Data for Polished SiC Surfaces

Atomic force microscopy (AFM) of the SiC surfaces provided using both coated particles and soft functionalized particle based slurries is shown in this example. The surfaces of silicon faced SiC samples were polished using different concentration of oxidizers, types and concentrations of particles. The polishing equipment and the conditions were the same as outlined in the Example 1 as described above.

AFM data was obtained for the surface of the silicon face on-axis 6H SiC wafer after polishing with a soft functionalized particles slurry having silica cores (0.1 M $KMnO_4$, 75 nm silica soft functionalized with insoluble $Mn^{+3}$ and $Mn^{+4}$ compounds (oxides and/or chlorides). The area of the AFM scan was 10 micron by 10 microns. The functionalization was provided by stirring the silica particles in permanganate solution for 10 minute in acidic pH conditions followed by polishing. The AFM of the resulting surface evidenced terraced structures which correspond to the atomic planes in the SiC each terrace corresponding to with a height of about 2.5 A. The root mean square surface roughness was less than 2 A.

Similar terracing of the surface was obtained when Mn(III)/Mn(iV) coated silica particles were used in a permanganate slurry. The slurry comprised 10% coated 75 nm silica particle+0.3 mole $KMnO_4$ solution. The surface roughness was found to be less than 2 A, while atomic terracing corresponding to 2.5 A was also found. These results were observed on a on-axis 6H SiC wafer on the silicon face. If an off axis wafer is used, no terracing was observed, however the surface roughness was found to be very low (typically less than 2 A). Data obtained showed that the surface of 8 degree of SiC Si faced wafer was polished with 1% coated 135 nm silica particle in a slurry containing 0.3 M $KMnO_4$ solution.

The use of alumina coated particles was found to provide different surface terracing. However, the surfaces formed were very smooth. AFM data obtained for the surface of Si faced 6H SiC surface polished with 1% percent Mn(III)/Mn (IV) coated alumina with 0.35 M $KMnO_4$ slurry. The rms surface roughness was found to be less than 2 A. The terracing was found to be different as compared to the terracing obtained using silica particles.

The used of mixed particles was also found to provide high quality surface finishes. AFM data was obtained for 6H silicon faced SiC carbide polished with 0.1% 5 nm coated diamond and 1% 75 nm coated silica (coating is Mn(III)/Mn(IV) compounds) with 0.3 M $KMnO_4$ oxidizer. An excellent surface finish was found having an with rms less than 2 A, with no detection of scratches. Low roughness of polishing can also be expected from other polytypes of silicon carbide, single crystal, polycrystal or amorphous materials.

Example 6

Mixed Particle Systems

The polishing rate can be enhanced if the coated particles or soft functionalized particles are mixed with hard abrasives. The table below shows the removal rate of SiC silicon faced 6H substrates using various mixed particle systems. In each case the concentration of the $KMnO_4$ oxidizer was kept at 0.3 M with pH 3.0. The coating refers to Mn(III)/Mn(IV) coating on the core.

| Abrasive Particle | Removal Rate (nm/hr) |
|---|---|
| 1% coated 135 nm silica particles | 1500 |
| 1% coated particle + 1% coated 0.8 micron alumina | 1900 |
| 1% coated particle + 0.1% 0.2 micron diamond BN | 1656 |

Example 7

Si Face Versus Carbon Face SiC Substrates

The polishing rate for SiC was found to depend on the nature of the silicon carbide surface. The carbon faced SiC was found to polish at much higher rates as compared to the silicon faced SiC material. Under same polishing conditions using 1% coated particle (used in example 1 pH 3.0) using 0.3 M $KMnO_4$ slurry the polishing rate for the silicon face was 1,475 nm/hr, while of the carbon face was approximately 5,000 nm/hr. This high removal rate was attributed to the rapid reaction of the carbon with the slurry chemistry.

Example 8

Polishing of Si—C Containing Compounds

Slurry according to embodiments of the invention generally have higher polishing rates for amorphous SiC comprising materials that can have varying contents of carbon and or silicon. One example of a material of this type is BD1 which is a low dielectric constant material manufactured by Applied Materials (Santa Clara, Calif.). This material has a trade name of Black Diamond This material has varying amounts of Si—C—O and can also be doped with nitrogen. The removal rate at PH 3.0 using 1% coated 75 nm silica particles at 2 psi was found to be 1374 A/min, as compared 168 A/min for uncoated silica particles.

Example 9

Formation of Functionalized Particles

The formation of soft functionalized particles can be obtained by breaking down chemicals in the presence of core (e.g. abrasive) particles. If the breakdown is very slow, the coating on the core particles may be very thin that may not be easily discernable by visual means. The functionalization of cores can be determined by observing the flow, agglomeration, or redispersion or gelling behavior of the particles. In this example abrasive diamond, silica and alumina particles were immersed in 0.3M $KmO_4$ solution for extended period exceeding 10 minutes. The slurries were stirred and were exposed to standard artificial lighting conditions. The particle concentration was varied from 0.1 percent to 20 percent. The pH for monitoring was typically in the acid environments (pH 2 to pH 7). The particle characteristics we observed and compared with similar concentration particles that we not dipped in permanganate solution. To compensate for the permanganate a similar amount of salt KCl was added to the particle solution. The following observation were made. The silica based colloidal solution in absence of permanganate solution typically gelled (formed a glob) in acidic pH conditions. The gelling rate varied from several minutes to days depending on the concentration of particles and the salt concentration. Such gelling made the slurry unusable for CMP applications. In contrast the $KMnO_4$ treated silica particles in acidic environments did not gel under any concentration conditions, thus suggesting functionalization of the particles with modification of the surface characteristics. The gelling behavior of the functionalized particles was found to be similar to the Mn(III)/Mn(IV) coated particles suggesting a very thin functionalization layer can significantly alter the gelling characteristics. The alumina and diamond functionalized particles also showed unique flow characterstics. The redispersion of the particles was much easier compared to non-functionalized particles.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the following claims.

We claim:

1. A slurry composition, comprising:
   an aqueous liquid carrier;
   an oxidizing agent comprising a first transition metal compound including a first transition metal that is soluble in said aqueous liquid carrier;
   a second transition metal compound including chlorine in said slurry other than said first transition metal compound that is insoluble in said aqueous liquid carrier (insoluble second transition meta compound);
   a plurality of core particles having a soft surface portion comprising a transition metal compound layer that provides a Mohs hardness <6 including said insoluble second transition metal compound and another insoluble transition metal compound;

wherein said slurry includes particles in addition to said plurality of core particles comprising at least one of said first transition metal compound and said insoluble second transition metal compound.

2. The slurry of claim 1, wherein said first transition metal compound comprises $KMnO_4$.

3. The slurry of claim 1, wherein said another insoluble transition metal compound comprises $MnO_2$, said insoluble second transition metal compound comprises and $MnCl_3$, and said oxidizing agent comprising said first transition metal compound comprises potassium permanganate.

4. The slurry of claim 1, wherein said oxidizing agent includes at least one of a peroxide, ammonium cerium nitrate, a persulfate, a chromate, a permanganate, and a perruthenate.

5. The slurry of claim 1, wherein a concentration of said oxidizing agent is 0.1 M to 0.4 M.

6. The slurry of claim 1, wherein a pH of said slurry is <4.

7. The slurry of claim 1, wherein said oxidizing agent and said insoluble second transition metal compound both comprise Mn.

* * * * *